(12) United States Patent
Uchiyama et al.

(10) Patent No.: US 6,368,123 B2
(45) Date of Patent: Apr. 9, 2002

(54) IC CARD CONNECTOR HAVING A SHUTTER MECHANISM

(75) Inventors: Atsushi Uchiyama; Toru Wagatsuma, both of Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/799,778

(22) Filed: Mar. 6, 2001

(30) Foreign Application Priority Data

Mar. 7, 2000 (JP) ......................................... 2000-067168

(51) Int. Cl.⁷ ............................................... H01R 13/44
(52) U.S. Cl. ........................................ 439/138; 235/482
(58) Field of Search ................................ 235/441, 482; 439/135–138, 540.1

(56) References Cited

U.S. PATENT DOCUMENTS 6,120,322 A 9/2000 Ho et al.

FOREIGN PATENT DOCUMENTS

| JP | 1-161683 | * | 6/1989 |
| JP | 3018958 | | 9/1995 |

* cited by examiner

Primary Examiner—Khiem Nguyen
(74) Attorney, Agent, or Firm—Brinks Hofer Gilson & Lione

(57) ABSTRACT

An IC card connector comprising a housing having plural connector terminals, guide frames disposed oppositely to each other at both side portions of the housing and having guide grooves in which an IC card to be connected to the connector terminals is inserted and held, an insertion port defined by the guide frames for insertion therein of the IC card, and shutter members for opening and closing the insertion port, wherein a thin-walled cutout recess is formed on the surface side of each of the shutter members for preventing abutment of the shutter member against an expanded portion formed on the surface or the back of the IC card when inserted into the insertion port.

3 Claims, 4 Drawing Sheets

IC CARD CONNECTOR HAVING A SHUTTER MECHANISM

BACKGROUND OF THE INVENTION

1. Field of the Invention

The present invention relates to a structure of an IC card connector for which an IC card used, for example, as a storage medium in a personal computer or the like is inserted and ejected.

2. Description of the Prior Art

A certain personal computer is provided with an IC card connector in which an IC card as a storage medium is mounted.

This IC card is mounted to the IC card connector and carries out a writing or reading of required information. In the IC card is incorporated a semiconductor such as a semiconductor IC (integrated circuit); besides, there is used a high-frequency circuit. Therefore, the influence of, for example, an electromagnetic wave noise is apt to be exerted on the exterior. As a measure against EMI (electromagnetic interference) (radiation noise), a certain IC card connector is provided with a shielding member such as a shielding plate.

There is known an IC card connector having a shutter mechanism in an IC card insertion port of the connector so that the interior can not be seen easily when an IC card is not inserted therein. In such an IC card connector provided with a shutter mechanism, shutter members capable of being opened and closed, which are attached to a front side of the connector, are usually formed integrally with a housing or guide frames formed in the housing.

More particularly, according to the structure of the conventional IC card connector provided with a shutter mechanism, a housing having plural connector terminals and guide frames into which an IC card is inserted and held are formed using an insulating material such as a synthetic resin or an electrically conductive material such as a metallic plate, a support member for supporting the shutter members is formed integrally on the front side of the housing and the guide frames, i.e., on the side where an IC card is inserted, and the shutter members are supported by the support member rotatably so that they can be opened and closed.

In the above structure of the conventional IC card connector, however, when an IC card is inserted into the connector, the associated shutter member rotates, and when the insertion of the IC card has been completed, the shutter member is superimposed on an IC card face in the thickness direction of the card, so that the connector size in its thickness direction increases by an amount corresponding to the thickness of the shutter member, thus giving rise to the problem that the reduction in thickness of the connector is difficult.

In this connection, even if the shutter members are formed thin, there arises the problem that the shutter members are deformed or damaged when rotating upon insertion of IC cards into the connector.

SUMMARY OF THE INVENTION

Accordingly, it is an object of the present invention to solve the above-mentioned problems and provide a structure of an IC card connector provided with a shutter mechanism and capable of attaining the reduction of thickness while maintaining the strength of shutter members and permitting easy insertion therein of an IC card.

According to a first embodiment the present invention for solving the above-mentioned problems there is proveded an IC card connector comprising a housing having plural connector terminals, guide frames disposed opposedly to each other at both side portions of the housing and having guide grooves into which an IC card to be connected to the connector terminals is inserted and held, an insertion port defined by the guide frames for insertion therein of the IC card, and shutter members for opening and closing the insertion port, wherein a thin-walled cutout recess is formed on the surface side of each of the shutter members for preventing abutment of the shutter member against an expanded portion formed on the surface or the back of the IC card when inserted into the insertion port.

According to a second embodiment of the invention, thick-walled flat portions for abutment thereagainst of a front portion of the IC card when inserted into the insertion port are formed at both side ends of the cutout recess formed in each of the shutter members.

According to a third embodiment of the invention, the IC card connector further includes a support frame mounted bridgewise on front sides of the guide frames, the guide grooves are formed in two upper and lower stages in the guide frames and the shutter members are supported pivotably by the support frame so that the shutter members can be opened and closed each individually correspondingly to the guide grooves.

DETAILED DESCRIPTION OF THE PREFERRED EMBODIMENTS

Figure 1:
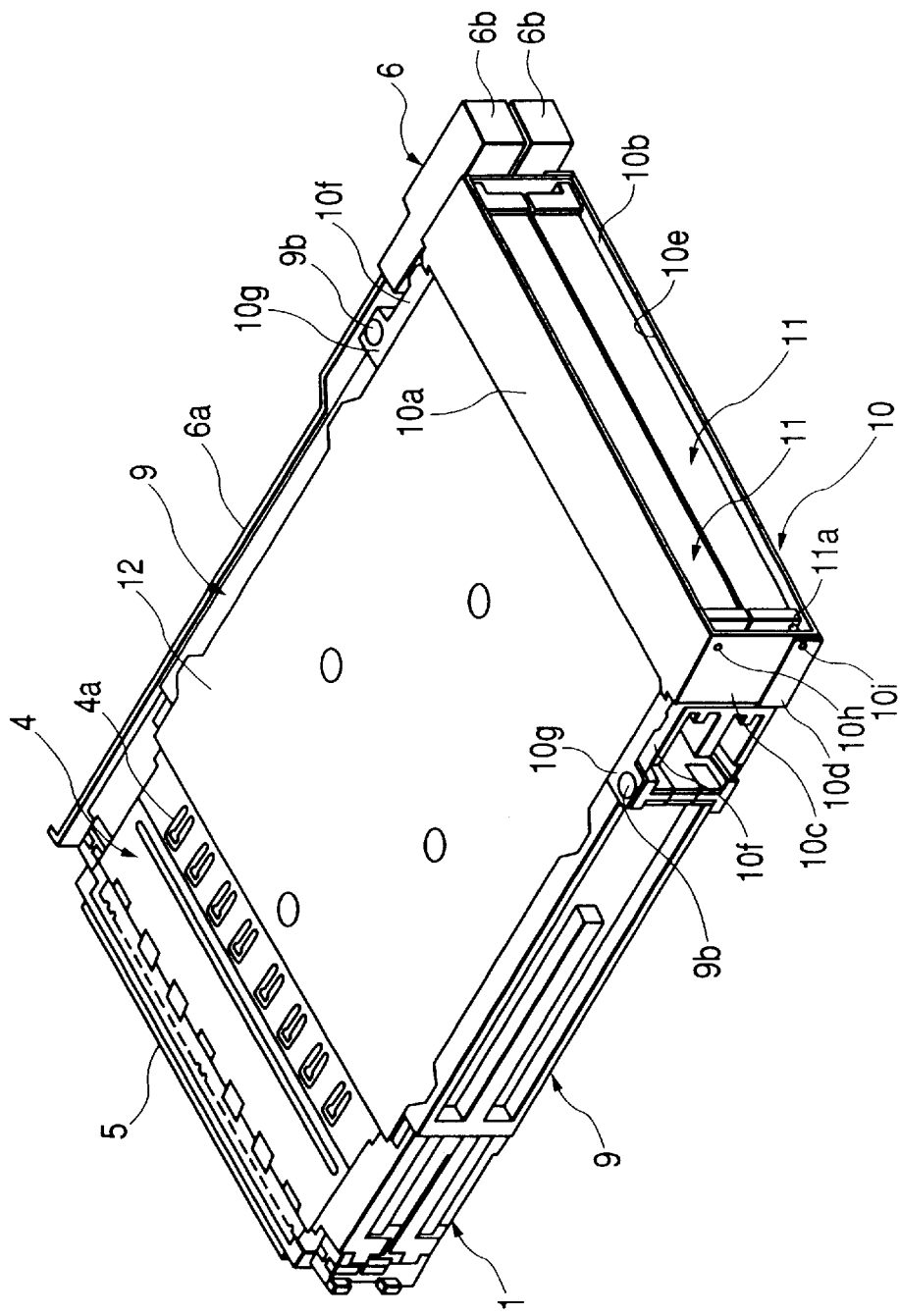
FIG. 1 is a perspective view showing an IC card connector according to the first embodiment of the present invention.
Figure 2:
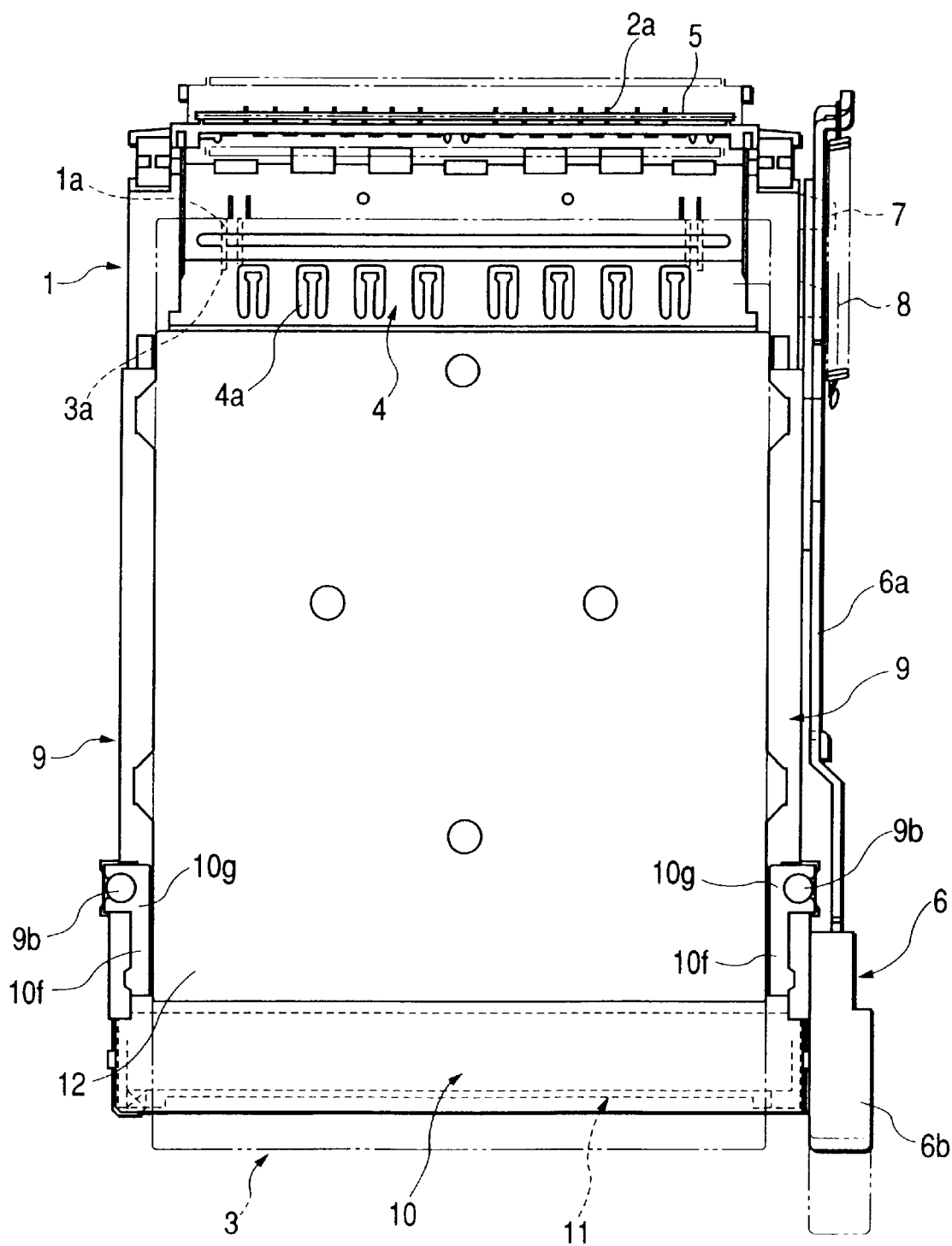
FIG. 2 is a plan view thereof.
Figure 3:
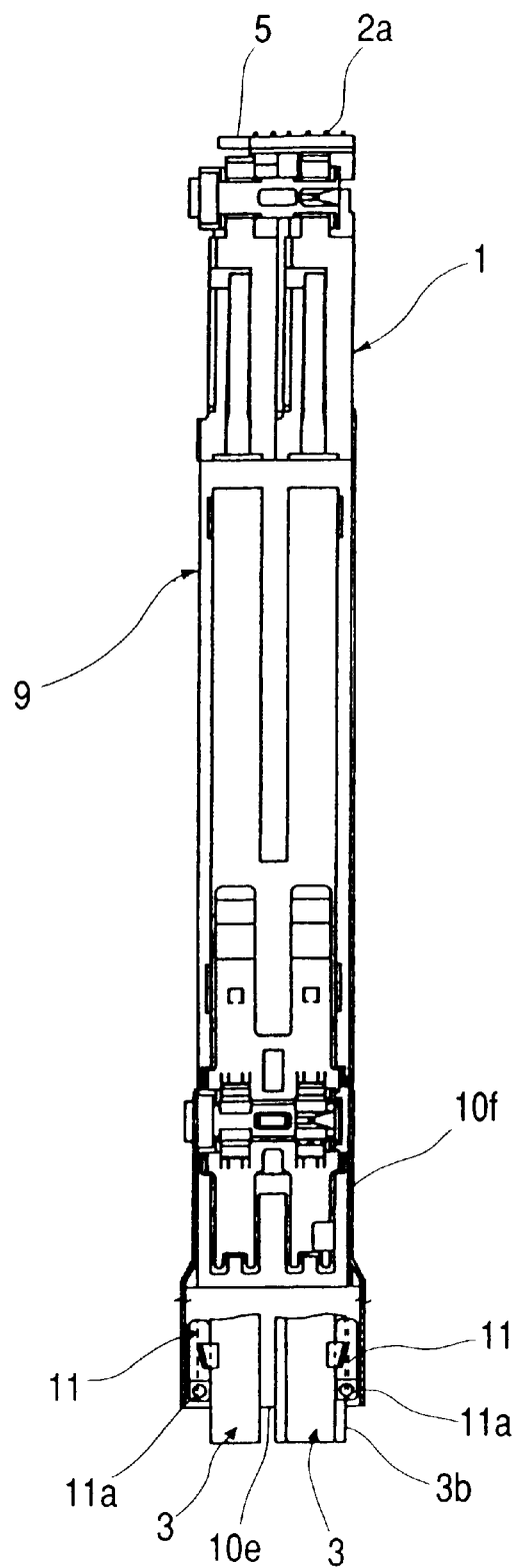
FIG. 3 is a side view thereof.
Figure 4:
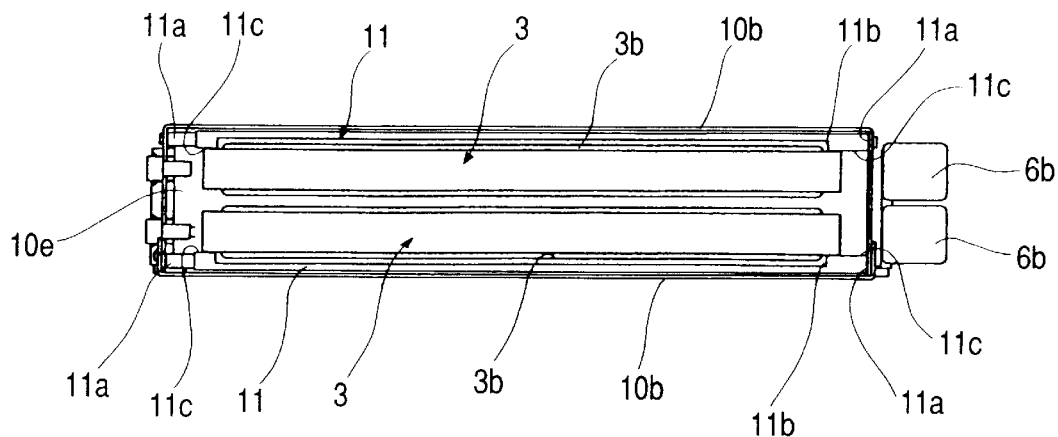
FIG. 4 is a front view thereof.

Embodiments of the present invention are illustrated in FIGS. 1 to 5. FIGS. 1 to 4 illustrate an IC card connector according to the first embodiment of the present invention, of which FIG. 1 is a perspective view of the IC card connector, FIG. 2 is a plan view thereof, FIG. 3 is a side view thereof, and FIG. 4 is a front view thereof.

In those figure, a housing 1 is formed of an insulating material such as a synthetic resin and is internally provided with a receptacle portion 1a for insertion therein of an IC card 3. Plural connector terminals 2 formed of an electrically conductive metallic material are arranged side by side on an inner bottom of the receptacle portion 1a. Connecting portions 2a are formed at one ends of the connector terminals 2. The connecting portions 2a are drawn out to the exterior of the housing 1 and are connected to a relay substrate 5. At the opposite ends of the connector terminals 2 are formed contact portions (not shown) which are drawn out into the receptacle portion 1a of the housing 1 and which are connected to socket connectors 3a of the IC card 3.

A shielding plate 4 is formed in a generally rectangular shape using a metallic plate such as a stainless steel plate or a steel plate and is disposed so as to cover an upper surface side of the housing 1 with the connector terminals 2 juxtaposed therein. On the shielding plate 4 are formed plural contact pieces 4a side by side which are cut and raised pieces and which come into contact with dimples (grounding lugs) (not shown) of the IC card 3.

The relay substrate 5 is constituted by a laminate plate of a phenolic resin for example. On the surface of the relay substrate 5 is formed a connection land portion (not shown) to which plural circuit patterns (not shown), the connector terminals 2 and the shielding plate 4 are electrically connected by soldering. The relay connector 5 is disposed on a rear side of the housing 1, and when the housing 1 is mounted onto a circuit board (not shown), the relay substrate 5 is fitted in a card edge connector installed on the circuit board.

The card edge connector, which is a substrate mounting type relay connector, provides an electric connection between the connecting portions 2a of the connector terminals 2 and circuit patterns (not shown) on a main circuit board through circuit patterns (not shown) formed on the relay substrate 5.

An ejection knob 6 is provided with a slider portion 6a formed by a metallic plate and an operating knob portion 6b attached to one end side of the slider portion 6a. The ejection knob 6 is slidably secured to the housing 1 and also to a side portion of one of paired guide frames 9 which will be described later, the guide frames 9 being disposed oppositely to each other at both side portions of the housing 1. The opposite end side of the ejection knob 6 is engaged with an ejection lever 7 which is also formed by a metallic plate. When the ejection knob 6 is pushed, a free end (not shown) of the ejection lever 7 turns and pushes an end portion of the IC card 3, whereby the IC card, which is accommodated in the receptacle portion 1a of the housing 1, is pushed in an ejecting direction and is ejected from the receptacle portion 1a. A coiled spring 8 is a return spring which urges the ejection lever 7 toward an initial position thereof.

Guide frames 9 are each formed in the shape of a square rod using an insulating material such as a synthetic resin. One ends of the guide frames 9 are engaged with both side portions of the housing 1 and a hollow area surrounded with the housing 1 and the paired guide frames 9 serves as an IC card inserting portion into which the IC card 3 is inserted and held. In an inner side face of each guide frame 9 is formed a guide groove 9a into which the IC card 3 is inserted and held. The guide grooves 9a of the paired guide frames 9 are formed in two upper and lower stages oppositely to each other. A mounting hole 9b is formed in each guide frame 9 at a position close to the front end of the guide frame for mounting the frame to a circuit board (not shown) with screw for example. A grounding piece 10g of a support frame 10 which will be described below is attached to the mounting hole 9b and is connected to a ground pattern formed on the circuit board.

A support frame 10 is formed by bending an electrically conductive material such as a metallic plate. The support frame 10 is composed of an upper frame portion 10a and a lower frame portion 10b. Side plate portions 10c and 10d of the upper and lower frame portions 10a, 10b, respectively, are engaged with each other, whereby the support frame 10 is formed in a box shape having a through opening 10e. The upper frame portion 10a is formed at both ends thereof with a pair of elastically deformable mounting pieces 10f which are extended outwards. On a free end side of each elastic mounting piece 10f is provided the grounding piece 10g which is mounted to the mounting hole 9b of the associated guide frame 9 with screw for example.

A pair of shutter members 11 formed of an insulating material such as a synthetic resin are mounted on one end side of the opening 10e corresponding to the IC card insertion side. The shutter members 11 are supported pivotably for opening and closing motions by shaft holes 10h and 10i formed in the side plate portions 10c and 10d, respectively, of the support frame 10 and by pivot shafts 11a provided on side faces of the shutter members 11.

An elongated, thin-walled, cutout recess 11b is formed in the surface of each shutter member 11 into which the IC card 3 is inserted. Further, thick-walled flat portions 11c are formed respectively on both opposed side ends of the recess 11b.

Since the recess 11b is formed in each shutter member 11, it is possible to avoid abutment of the shutter member against an expanded portion 3b of the IC card when the IC card is inserted into the insertion port. Consequently, the IC card connector can be reduced in thickness.

Besides, since the thick-walled flat portions 11c are formed at both opposed side ends of the recess 11b, the front portion of the IC card comes into abutment against the flat portions 11c when inserted into the insertion port and hence a stress is not imposed on the recess 11b, whereby it is possible to prevent deformation and damage of the shutter member 11.

A certain IC card 3 does not have the expanded portion 3b, but even such an IC card can be inserted into the IC card connector without any trouble, thus permitting components to be used in common.

In the case where the support frame 10 is mounted bridgewise on the front sides of the guide frames 9, the paired shutter members 11 are supported by the support frame 10 so that they can be opened and closed each individually correspondingly to the guide grooves 9a formed in two upper and lower stages in the guide frames 9, that is, so as to perform the motion of a pair of folding doors.

Thus, even when the IC card 3 is inserted into one of the two upper- and lower-stage guide grooves 9a, the shutter member 11 on the IC card-free side can be kept closed.

Since the support frame 10 is formed separately from the guide frames 9 and is elastically sandwiched in between the guide frames 9 through its elastic mounting pieces 10f, the support member can be mounted easily and hence components of the IC card connector with the shutter mechanism and those of an IC card connector without the shutter mechanism can be used in common.

Further, since the support frame 10 is formed by bending a metallic plate so as to surround the peripheral surface of the opening 10e which is the insertion port for the IC card 3, there can be attained an outstanding effect against EMI (radiation noise).

A cover member 12 is formed in a flat plate shape using an electrically conductive material such as a metallic plate and is disposed so as to cover the upper or the lower surface side of the housing 1 and the guide frames 9. A more outstanding shielding effect can be obtained by covering the IC card inserting portion with the cover member 12.

Figure 5:
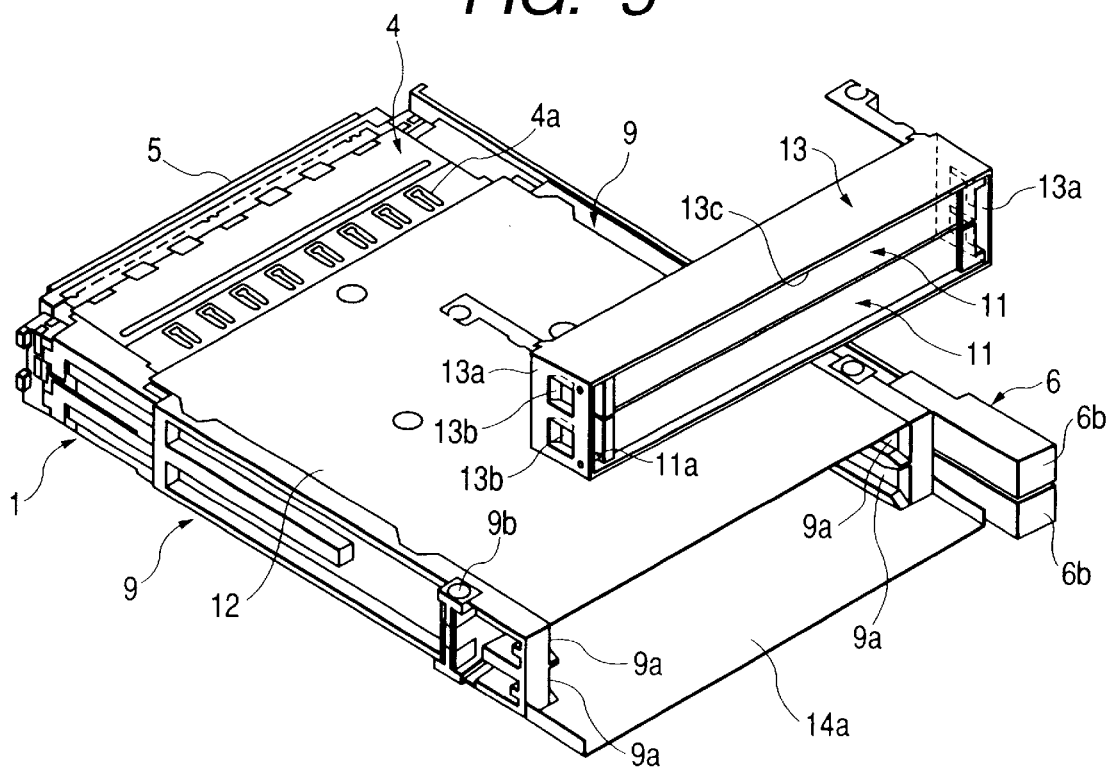
FIG. 5 is a partially exploded perspective view showing an IC card connector according to the second embodiment of the present invention.

FIG. 5 illustrates an IC card connector according to the second embodiment of the present invention.

As to the same components as those described above in connection with FIGS. 1 to 4, they will be identified by the same reference numerals as in those figures and explanations thereof will be omitted.

The construction shown in FIG. 5 and the construction of the first embodiment shown in FIGS. 1 to 4 are different in that the support structure used in the former and that used in the latter are partially different from each other.

A support frame 13 used in this second embodiment is formed in a general U shape by bending a single metallic plate, with the underside being open. A cover member 14 which covers the undersides of the housing 1 and the guide frames 9 is extended to the lower opening of the support frame 13. The extended portion, indicated at 14a, of the cover member 14 covers the lower opening of the support frame 13.

Thus, since the cover member 14 also serves as a part of the support frame 13, the structure of the support frame 13 can be simplified and hence it is possible to simplify the structure of the shutter mechanism.

On each of both side plate portions 13a of the support frame 13 are formed a pair of upper and lower projections 13b. The projections are formed by cutting and raising the associated side plate portion 13a partially inwards. The projections 13b are located at positions corresponding to the two upper and lower guide grooves 9a formed in the guide frames 9. IC cards 3 inserted into the opening 13c which serves as an insertion port for the IC card are guided by the projections 13b formed on both side plate portions 13a of the support frame 13 into the guide grooves 9a of the guide frames 9, so that no gap is formed between the front ends of the guide frames 9 and the IC card insertion port, thus permitting the IC cards 3 to be inserted easily into the guide grooves 9a of the guide frames 9.

In the IC card connector according to the present invention, as set forth above, a thin-walled cutout recess for preventing abutment of each shutter member against the expanded portion on the surface or the back of the IC card upon insertion of the IC card into the insertion port is formed on the surface side of each of the shutter members which open and close the IC card insertion port. Therefore, it is possible to avoid abutment of each shutter member against the expanded portion of the IC card when inserted into the IC card insertion port, thus permitting the reduction in thickness of the IC card.

Moreover, since thick-walled flat portions for abutment thereagainst of the front portion of the IC card when inserted into the IC card insertion port are formed on both side ends of the cutout recess in each shutter member, the front portion of the IC card when inserted into the insertion port comes into abutment against the flat portions, with stress not imposed on the recess, whereby it is possible to prevent deformation and damage of the shutter member.

Further, a support member is mounted bridgewise on the front sides of the guide frames, the guide frames are formed in two upper and lower stages, and the shutter members are supported pivotably by the support frame so that they can open and close each individually correspondingly to the guide grooves. Therefore, even when the IC card is inserted one of the upper and lower guide grooves, the shutter member on the IC card-free side can be kept closed.

What is claimed is:

1. An IC card connector comprising:

a housing having plural connector terminals;

guide frames disposed opposedly to each other at both side portions of the housing and having guide grooves into which an IC card to be connected to the connector terminals is inserted and held;

an insertion port defined by the guide frames for insertion therein of the IC card; and shutter members to open and close the insertion port, wherein a thin-walled cutout recess is formed on a surface side of each of the shutter members to prevent abutment of the shutter member against an expanded portion formed on at least one of a surface and back of the IC card when inserted into the insertion port, and thick-walled flat portions for abutment thereagainst of a front portion of the IC card when inserted into the insertion port are formed at both side ends of the cutout recess formed in each of the shutter members.

2. An IC card connector according to claim 1, further including a support frame mounted bridgewise on front sides of the guide frames, and wherein the guide grooves are formed in two upper and lower stages in the guide frames, and the shutter members are supported pivotably by the support frame so that the shutter members can be opened and closed each individually correspondingly to the guide grooves.

3. An IC card connector comprising:

a housing having plural connector terminals;

guide frames disposed opposedly to each other at both side portions of the housing and having guide grooves into which an IC card to be connected to the connector terminals is inserted and held;

an insertion port defined by the guide frames for insertion therein of the IC card; and shutter members to open and close the insertion port, wherein a thin-walled cutout recess is formed on a surface side of each of the shutter members to prevent abutment of the shutter member against an expanded portion formed on at least one of a surface and back of the IC card when inserted into the insertion port, and wherein a support frame is mounted bridgewise on front sides of the guide frames, the guide grooves are formed in two upper and lower stages in the guide frames, and the shutter members are supported pivotably by the support frame such that the shutter members are individually opened and closed corresponding to the particular guide groove.

* * * * *